United States Patent
Wang et al.

(10) Patent No.: US 8,949,752 B2
(45) Date of Patent: Feb. 3, 2015

(54) SYSTEM AND METHOD OF EMULATING MULTIPLE CUSTOM PROTOTYPE BOARDS

(71) Applicant: Synopsys, Inc., Mountain View, CA (US)

(72) Inventors: Ming-Yang Wang, Lafayette, CA (US); Sweyyan Shei, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/089,522

(22) Filed: Nov. 25, 2013

(65) Prior Publication Data
US 2014/0157215 A1    Jun. 5, 2014

Related U.S. Application Data

(60) Provisional application No. 61/732,296, filed on Dec. 1, 2012.

(51) Int. Cl.
*G06F 17/50* (2006.01)
*G06F 11/267* (2006.01)

(52) U.S. Cl.
CPC ............ *G06F 17/505* (2013.01); *G06F 11/267* (2013.01)
USPC ................................ 716/105; 703/13; 703/23

(58) Field of Classification Search
None
See application file for complete search history.

(56) References Cited

U.S. PATENT DOCUMENTS

| | | | |
|---|---|---|---|
| 5,425,036 A | 6/1995 | Liu et al. | |
| 5,457,408 A | 10/1995 | Leung | |
| 5,896,494 A | 4/1999 | Perugini et al. | |
| 5,960,191 A * | 9/1999 | Sample et al. | 703/28 |
| 5,991,897 A | 11/1999 | Perugini et al. | |
| 6,002,868 A | 12/1999 | Jenkins et al. | |
| 6,754,881 B2 | 6/2004 | Kuhlmann et al. | |
| 6,842,729 B2 | 1/2005 | Sample et al. | |
| 6,961,691 B1 * | 11/2005 | Selvidge et al. | 703/28 |
| 7,072,825 B2 * | 7/2006 | Wang et al. | 703/28 |
| 7,353,162 B2 | 4/2008 | Huang et al. | |
| 7,424,416 B1 * | 9/2008 | Cavanagh et al. | 703/13 |
| 8,281,280 B2 | 10/2012 | Chang et al. | |
| 2011/0202894 A1 | 8/2011 | Chang et al. | |
| 2011/0251836 A1 * | 10/2011 | Wang et al. | 703/28 |
| 2013/0035925 A1 | 2/2013 | Chang et al. | |

(Continued)

OTHER PUBLICATIONS

Product Listing for "CHIPit Extension Boards," 2011 Synopsys, 4 pages, see file protected datasheet at http://www.synopsys.com/Systems/FPGABasedPrototyping/CHIPit/Pages/CHIPit_extension_board.aspx.*

(Continued)

*Primary Examiner* — Leigh Garbowski
(74) *Attorney, Agent, or Firm* — Kilpatrick Townsend & Stockton LLP

(57) ABSTRACT

An emulation system integrates multiple custom prototyping boards for emulating a circuit design. A first custom prototyping board including at least one FPGA and an interface connected to a first set of wires coupling to the at least one FPGA. A second custom prototyping board includes at least one second FPGA and an interface connected to a second set of wires coupling to the at least second FPGA. An adaptor board connects to the first custom prototyping board and the second custom prototyping board through the first interface and the second interface. The adapter board controls emulation of the circuit design and controls communication through the partitioned circuit using at least one of the first set of wires and at least one the second set of wires.

20 Claims, 11 Drawing Sheets

(56) References Cited

U.S. PATENT DOCUMENTS

2013/0117007 A1 5/2013 Chang et al.
2013/0227509 A1 8/2013 Chang et al.

OTHER PUBLICATIONS

Non-Final Office Action for U.S. Appl. No. 13/597,997, mailed on Jun. 12, 2013, 8 pages.
Non-Final Office Action for U.S. Appl. No. 13/730,543, mailed on May 23, 2013, 8 pages.
Non-Final Office Action for U.S. Appl. No. 13/025,809, mailed on Apr. 13, 2012; 8 pages.
Notice of Allowance for U.S. Appl. No. 13/025,809, mailed on May 31, 2012, 8 pages.
Mao, H., "Prototyping the next-generation SoC verification platform", EDA & Development, Components in Electronics, Mar. 2011, 2 pages.
Notice of Allowance for U.S. Appl. No. 13/730,543 mailed Dec. 24, 2013, 9 pages.
Notice of Allowance for U.S. Appl. No. 13/597,997 mailed Jan. 13, 2014, 8 pages.
*Ex Parte Quayle* Action for U.S. Appl. No. 13/856,004 mailed Feb. 14, 2014, 7 pages.
Notice of Allowance for U.S. Appl. No. 13/856,004 mailed May 5, 2014.

* cited by examiner

Level 1
Co_Simulation or Co_Emulation With a Workstation

| Channel Information | Interconnection data | Probed data | Flags |

A packet transmitted from a serial transmitting device

*FIG. 8*

Interconnection data format

The interconnection data order for the packet on each board will be:

| | | |
|---|---|---|
| FPGA board 1 | Data to board 2 | Data to board 3 |
| FPGA board 2 | Data to board 3 | Data to board 1 |
| FPGA board 3 | Data to board 1 | Data to board 2 |

The boundary of different board data can be recognized after design setup by counting the number of bits or inserting address bits in between.

*FIG. 9*

SYSTEM AND METHOD OF EMULATING MULTIPLE CUSTOM PROTOTYPE BOARDS

CROSS-REFERENCES TO RELATED APPLICATIONS

This Application claims priority to and the benefit of U.S. Provisional Patent Application No. 61/732,296, filed Dec. 1, 2012 and entitled "SYSTEM AND METHOD OF EMULATING MULTIPLE CUSTOM PROTOTYPE BOARDS," the entire disclosure of which is hereby incorporated by reference for all purposes.

This application is related to co-pending U.S. patent application Ser. No. 13/856,004, filed Apr. 4, 2013 and entitled "PROTOTYPING AND EMULATION SYSTEM FOR MULTIPLE CUSTOM PROTOTYPE BOARDS," which claims benefit under 35 USC 119 (e) of U.S. provisional Application No. 61/582,194, filed on Dec. 30, 2011, and entitled "METHOD AND APPARATUS FOR TURNING CUSTOM PROTOTYPE BOARDS INTO CO-SIMULATION, CO-EMULATION SYSTEMS" and is a continuation-in-part of U.S. application Ser. No. 13/730,543, entitled "METHOD AND APPARATUS FOR TURNING CUSTOM PROTOTYPE BOARDS INTO CO-SIMULATION, CO-EMULATION SYSTEMS," filed on Dec. 28, 2012, which is a continuation-in-part of U.S. application Ser. No. 13/597,997, entitled "METHOD AND APPARATUS FOR VERSATILE CONTROLLABILITY AND OBSERVABILITY IN PROTOTYPE SYSTEM," filed on Aug. 29, 2012, which claims benefit under 35 USC 119(e) of U.S. Provisional Application No. 61/561,045 filed on Nov. 17, 2011. U.S. application Ser. No. 13/597,997 is a continuation-in-part of application Ser. No. 13/025,809, entitled "METHOD AND APPARATUS FOR VERSATILE CONTROLLABILITY AND OBSERVABILITY IN PROTOTYPE SYSTEM," filed on Feb. 11, 2011, now U.S. Pat. No. 8,281,280, which claims benefit under 35 USC 119 (e) of U.S. Provisional Application No. 61/304,328 filed on Feb. 12, 2010. U.S. application Ser. No. 13/730,543 also claims benefit under 35 USC 119 (e) of U.S. provisional Application No. 61/582,194, filed on Dec. 30, 2011, the contents of all of which are incorporated herein by reference in their entirety.

BACKGROUND OF THE INVENTION

1. Field of the Invention

The present invention relates to a method of building an emulation system using a plurality of custom prototyping boards and, more particularly, to a method of building a scalable, high throughput emulation system using a plurality of custom prototype boards with FPGA devices.

2. Description of the Prior Art

Various semiconductor, circuit, and integrated circuit ("IC") devices, such as system-on-chip ("SoC") devices, are emulated or verified during their design and development processes. As an example, highly-integrated SoC devices may power or support a wide variety of products to facilitate various hardware, software, and/or device applications. To meet these demands, SoC devices continue to increase in size and complexity, and their capabilities and manufacturability are in part aided by advance semiconductor processing technologies and availability of verified and well-developed libraries, e.g. design or circuit intellectual property ("IP") libraries. The development of SoCs or other circuits or devices in some cases nevertheless may increase the burden on design verification processes, methods, or systems. In some cases, verification may consume a significant amount of time or resources during an SoC development cycle.

Circuit design verification approaches can vary. Given the expectation for speed, the various approaches of software development, hardware development, or system validation may provide varying levels of observability and control. Field programmable gate array ("FPGA") prototype systems, for example, can provide improved system execution time due to its hardware-based implementation. Some FPGA verification systems, nevertheless, lack the ability to isolate some of the root causes of discoverable errors for various reasons. For example, the lack of visibility regarding the multitude of signals within the design. Depending on the environment, software, and hardware constraints, in some cases, deficiencies in certain FPGA vendor-specific verification tools may include access to a limited number of signals, and limited sample capture depth. Even combined with an external logic analyzer, FPGA vendor-specific verification tools, in some instances, may lack sufficient capabilities to isolate root cause errors during design verification.

Verification systems may also support co-simulation and co-emulation using the FPGA devices. However, the FPGA device and devices are generally part of a closed vendor proprietary system, and such vendor-specific verification tools typically only work with their own FPGA device types and typically cannot be customized to other FPGA type devices. Therefore, users can not use or design their own FPGA-based prototyping systems.

How to verify or validate a complex IC or system design becomes a big challenge as the gate count and size of the IC or system design keep increasing. Normally, designers prefer to do their own prototyping during designing stage to filter out all possible design errors before the IC or system design is moved to a next stage for stress testing to validate the IC or the whole system design. However, by doing their own prototyping, when a bug is found or a failure is occurred during the debugging stage, it is difficult to trouble-shoot the bug due to the fact that there is a limited resources in the prototyping boards or system to bring out or trace all the relevant signals in order to analyze the cause of the bug. Conventionally, designers can use a dedicate emulation system such as Quickturn's Palladium for emulating the IC or system design; however, it is very costly and not suitable for some IC or system prototyping.

In addition, SoC design verification requires both software and hardware working together, which is usually tested on a prototype board in order to make sure the system behaves as expected. Conventional dedicated FPGA emulation system is very costly. Software based simulation has the advantages by putting everything together at system level to verify the system while monitoring all the internal signals; however, it is very slow and hence not practical for system level testing for a complicated SoC design.

Customer built prototype board based on software and hardware integration provides a simple way to verify the system design, but it has limited capability to isolate the root cause of discovered errors due to the lack of controllability and observability of the prototype board.

Therefore, what is needed is a debugging methodology to work with the customer prototype boards to verify a circuit design.

BRIEF SUMMARY OF THE INVENTION

One embodiment in the present invention is to provide a method of integrating multiple custom prototyping boards into an emulation system for emulating a circuit design, comprising the steps of: a. receiving a first custom prototyping board comprising at least one first FPGA and a first interface connected to a first set of wires coupling to the at least one FPGA, the board being described by a first plurality of board description files; b. receiving a second custom prototyping board comprising at least one second FPGA and a second interface connected to a second set of wires coupling to the at least second FPGA, the board being described by a second plurality of board description files; c. providing at least one adaptor board to connect to the first custom prototyping board and the second custom prototyping board through the first interface and the second interface respectively, wherein the at least one adaptor board comprises at least one third FPGA, wherein the at least one third FPGA is coupled to the first set of wires and the second set of wires; and d. partitioning the circuit design according to the first plurality and the second plurality of board descriptions files into the at least one first FPGA, the at least one second FPGA and the at least third FPGA for emulating the circuit design, wherein at least one of the first set of wires is coupled to at least one the second set of wires through the partitioned circuit of the at least one third FPGA.

One embodiment in the present invention is to provide a system for circuit emulation, comprising: a first sub-system, comprising a first circuit board and a first serial transmitting device to transmit interconnection data and probe data of the first circuit board for each emulation cycle; and a second subsystem, comprising a controller for controlling the circuit emulation and a first serial receiving device to receive said interconnection data and probe data of the first circuit board, wherein the interconnection data and the probe data of an emulation cycle are packed within a packet transmitted from the first serial transmitting device to the controller through the first serial receiving device, wherein the received interconnection data of the emulation cycle is being forwarded to a third subsystem while the probe data of the emulation cycle is being received by the controller.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The accompanying drawings, which are incorporated in and constitute a part of this specification, illustrate implementations of inventive concepts and, together with the description, serve to explain various advantages and principles of the invention.

FIG. 8 illustrates a packet for transfer data between boards consistent with disclosed embodiments.

FIG. 9 illustrates how interconnection data order in a packet from each board can be pre-arranged to avoid congestion so that the interconnection data can be delivered to the destination board concurrently consistent with disclosed embodiments.

DETAILED DESCRIPTION OF THE INVENTION

The detailed explanation of the present invention is described as following. The described preferred embodiments are presented for purposes of illustrations and description, and they are not intended to limit the scope of the present invention.

Figure 1:
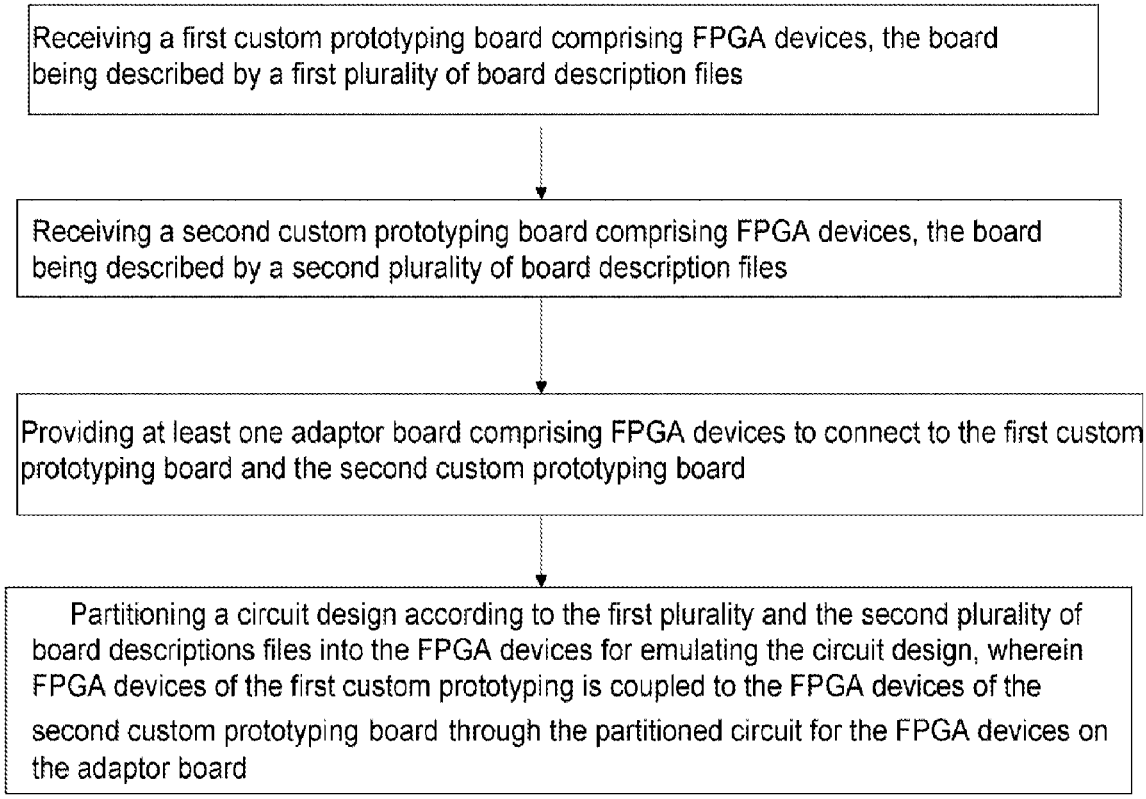
FIG. 1 is a flowchart diagram illustrating a method of debugging multiple prototype boards for emulating a circuit design consistent with disclosed embodiments.

Embodiment:

A method of debugging multiple prototype boards using emulation is disclosed. Please refer to FIG. 1, which illustrates a flow chart for debugging multiple prototype boards 100. Firstly, receive a first custom prototyping board comprising FPGA devices, the board being described by a first plurality of board description files. The board description files describe the components and the connections among the components on the first custom prototyping board. For example, if they are three FPGA devices and one connector on the board, the board description files will contain the type of each FPGA and the wire connections among the FPGA devices as well as the wire connections from the pins of the FPGA devices to the pins of the connector.

After the board description files are obtained, the foot print of the board and the type of components can be known. There can be as many as custom prototyping boards to be received in order to test a circuit design. In this Example, two custom prototyping boards are received. A second custom prototyping board has FPGA devices on board, the board being described by a second plurality of board description files. The second plurality of board description files describes the components and the connections among the components on the second custom prototyping board just like the first custom prototyping board. Then, provide at least one adaptor board to electrically couple to the first custom prototype board and the custom second prototype board through connectors. After the boards are connected, partition a circuit design according to the first plurality and the second plurality of board descriptions files into the FPGA devices for emulating the circuit design, wherein the FPGA devices of the first custom prototyping is coupled to the FPGA devices of the second custom prototyping board through the partitioned circuit of the FPGA devices on the at least one adaptor board.

As the prototype boards are obtained from customer(s), each of the first custom prototype board and the second custom prototype board are usually previously designed to debug a part of a circuit design. Each design team is focusing on debugging a particular prototype board. Later on, the prototype boards needs to be linked for the whole circuit design. In order to link all the prototype boards, one or more adaptor board can be provided to connect all the prototype boards without changing the foot print of the prototype boards. By doing so, a customer can reuse the prototype boards for debugging the circuit design without using expensive dedicated emulation system from the scratch. Please note that the adaptor boards can be used to connect variety of customer prototype boards even the customer prototype boards are obtained from different resources or customers.

Figure 7A:
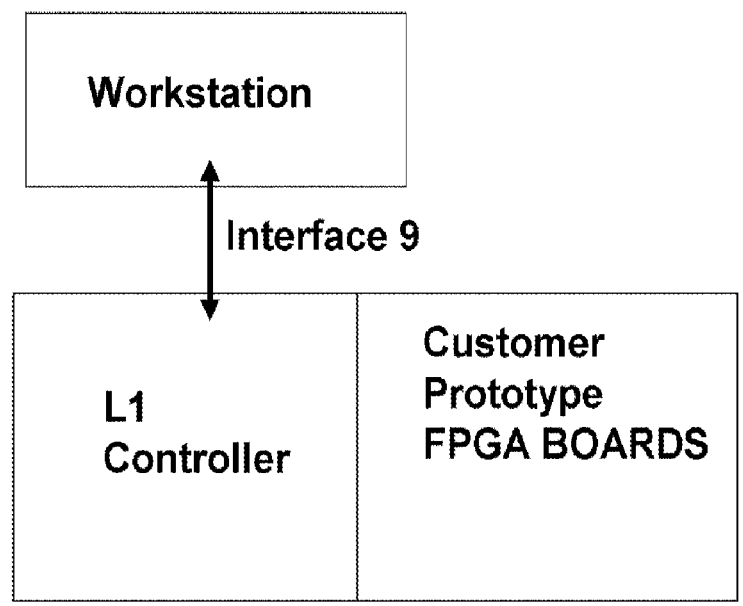
FIG. 7A illustrates a co-emulation or co-simulation mode where a part of a circuit design under test is simulated in a workstation and the workstation communicates with a L1 controller to debug the whole circuit design consistent with disclosed embodiments.

The method is scalable and can be used to connect as many customer prototype boards as needed. Please refer to FIG. 2, which illustrates a debugging system block diagram of a level one (L1) cluster. For example, there is an adaptor board having a L1 controller for controlling emulation of four customer prototype boards. The adaptor board can have emulation resources for clock generation, global reset signal generation, synchronization Logic analyzer (LA) sync control, memory for recording probed data of the customer prototype boards. The FPGA devices of the adaptor board and the FPGA devices on the customer prototype boards need to be configured before emulation starts. Setup software on a workstation can partition the circuit design across all the FPGA devices of the adaptor board and the customer prototype boards and prepares images to program the FPGA devices of the adaptor board and the customer prototype boards respectively. In a co-emulation or co-simulation mode, a part of a circuit design under test is simulated in the workstation and the workstation communicates with the L1 controller to debug the whole circuit design as shown in FIG. 7A.

Figure 2:
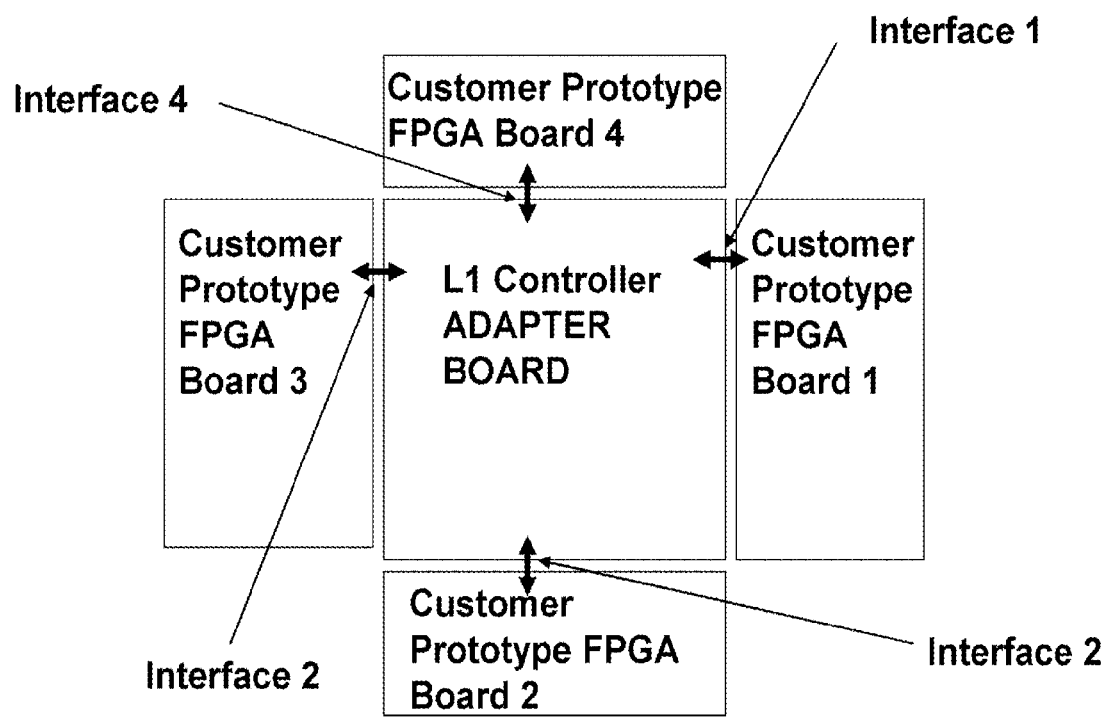
FIG. 2 illustrates a debugging system block diagram of a level one (L1) cluster consistent with disclosed embodiments.

As the number of the customer prototype boards increases, a L1 cluster described in FIG. 2 can be connected to other L1 clusters through a L2 adaptor having a L2 controller to communicate with each of the L1 controller. By doing so, the L2 adaptor can connect as many customer prototype boards as needed, for example, a total of 9 customer prototype boards in three L1 clusters can be connected through a L2 adaptor, wherein each of the three L1 clusters connects three customer prototype boards.

Figure 3:
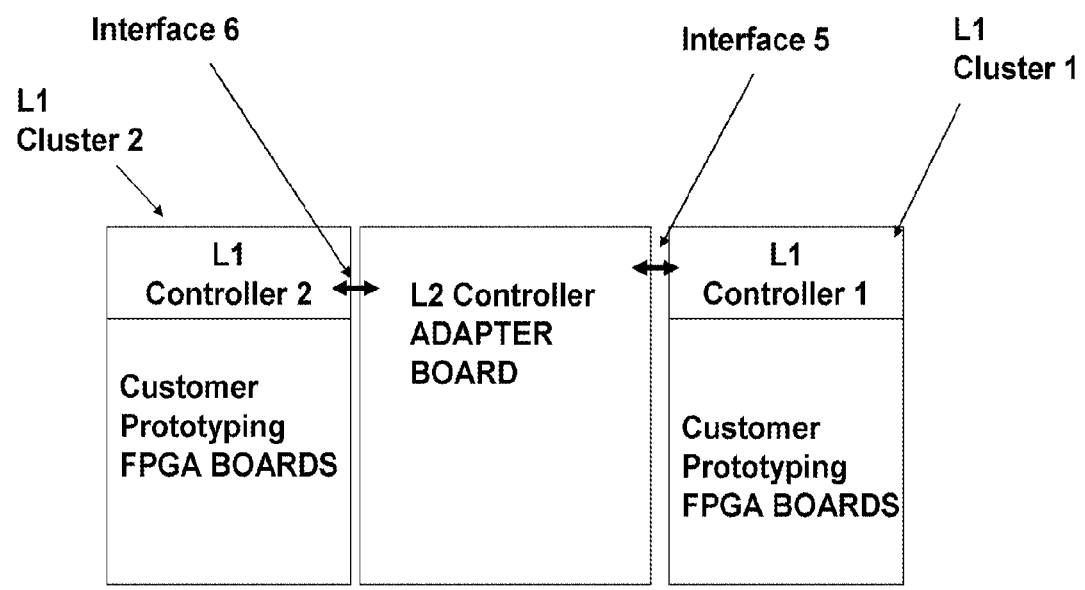
FIG. 3 illustrates a debugging system block diagram with a level two (L2) adaptor board consistent with disclosed embodiments.
Figure 7B:
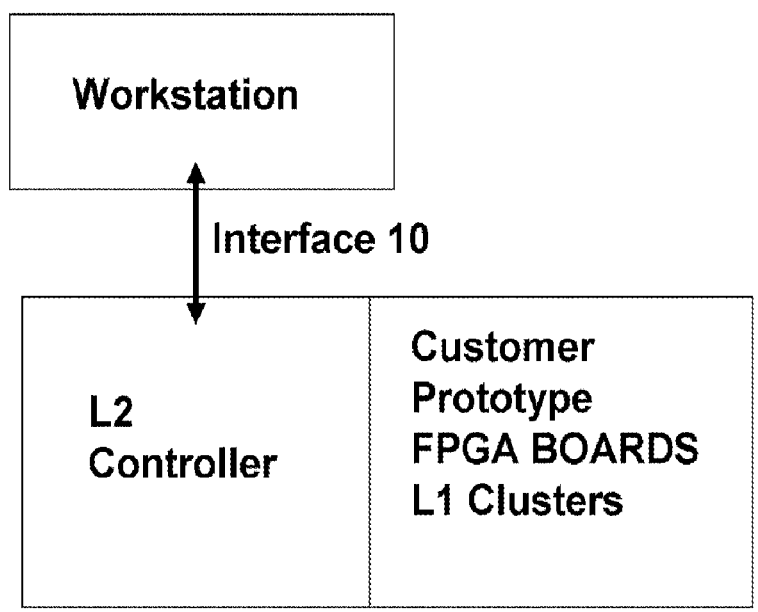
FIG. 7B illustrates a co-emulation or co-simulation mode where a part of a circuit design under test is simulated in a workstation and the workstation communicates with a L2 controller to debug the whole circuit design consistent with disclosed embodiments.

Please refer to FIG. 3, which illustrates a debugging system block diagram with a level two (L2) adaptor board. The L2 adaptor board includes: a L2 controller for cluster to cluster interconnections and emulation resources as described in L1 adaptor. The Level 2 controller can include interconnection fabric for switching and routing interconnection data from all the customer prototype boards through the L1 controller. The L2 adaptor board will be configured before emulation starts; setup software on a workstation partitions the circuit design across all the FPGA devices of the adaptor boards, including L1 and L2 adaptor boards, and the customer prototype boards and prepares images to program FPGA devices of the adaptor boards and the customer prototype boards respectively. In a co-emulation or co-simulation mode, a part of a circuit design under test is simulated in the workstation and the workstation communicates with the Level two controller to debug the whole circuit design as shown in FIG. 7B.

Figure 4:
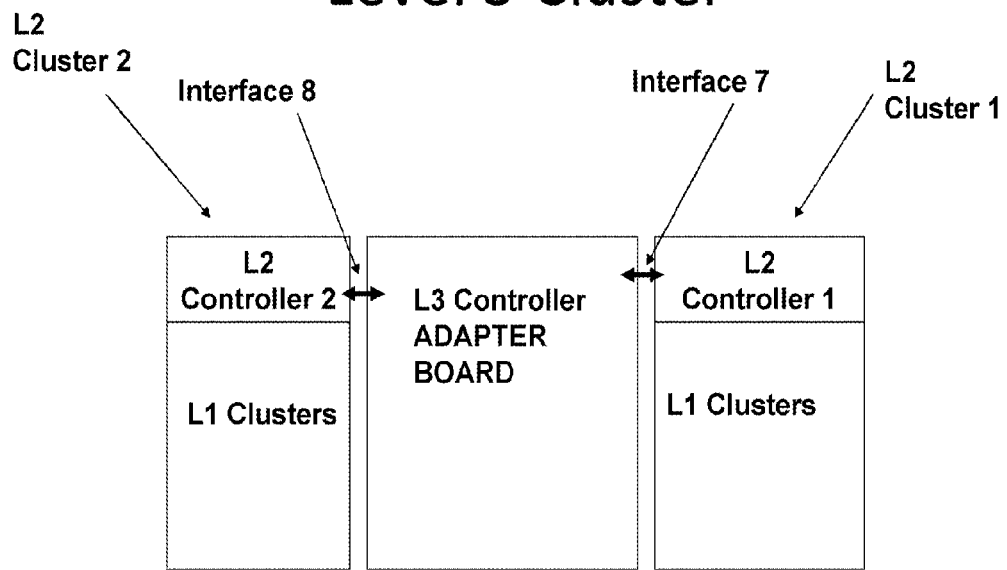
FIG. 4 illustrates a debugging system block diagram with a level three (L3) adaptor board consistent with disclosed embodiments.
Figure 7C:
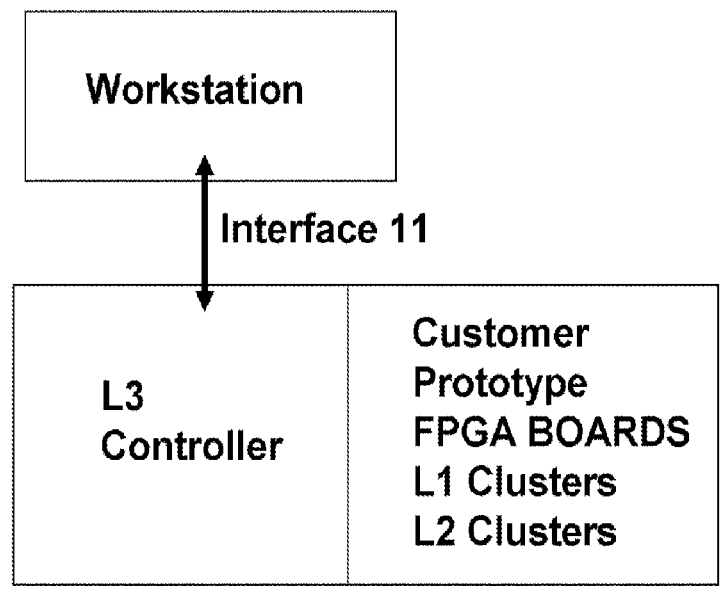
FIG. 7C illustrates a co-emulation or co-simulation mode where a part of a circuit design under test is simulated in a workstation and the workstation communicates with a L3 controller to debug the whole circuit design consistent with disclosed embodiments.

Please refer to FIG. 4, which illustrates a debugging system block diagram with a level three (L3) adaptor board. The L3 adaptor board can include: a L3 controller for cluster to cluster interconnections and emulation resources as described in level one (L1) adaptor and L2 adaptor. The Level 3 controller can include interconnection fabric for switching and routing interconnection data from all the customer prototype boards through the L2 controller and the L1 controllers. The L3 adaptor board will be configured before emulation starts; setup software on a workstation partitions the circuit design across all the FPGA devices of the adaptor boards, including L1, L2 and L3 adaptor boards, and the customer prototype boards and prepares images to program the FPGA devices of the adaptor boards and the customer prototype boards respectively. In a co-emulation or co-simulation mode, a part of a circuit design under test is simulated in the workstation and the workstation communicates with the L3 controller to debug the whole circuit design as shown in FIG. 7C.

However, as the number of I/O signals reach a limit, the board space or mechanical stability will become a bottleneck for testing such prototype boards. One embodiment of the present invention utilizes Serdes, such as fiber channel, to transfer data between boards. By doing so, all the data can be transmitted or received in serial to save I/O connections between boards. For example, a fiber channel is used for connecting a L3 controller with a L2 controller or for connecting a L2 controller with a L1 controller. The Fiber channel can be used whenever mechanical flexibility is the main concern.

For example, interface 5 and interface 6 in FIG. 3 each can use a connector to connect L2 adaptor board to a L1 adaptor board. Alternatively, interface 5 and interface 6 each can use a Serdes to connect L2 adaptor board to the L1 adaptor board. Likewise, interface 7 and interface 8 in FIG. 4 each can use a Serdes to connect L3 adaptor board to a L2 adaptor board. Unlike parallel lines to connect boards, data bits are serialized and packed in a packet for transmission. How to synchronize the timing among different boards becomes a major concern when using such serial transmission. That is, it will require some synchronization control for running the FPGAs in an emulation system. For the same reason, all the data bits must be prepared and delivered to a FPGA on a customer prototyping board before triggering next cycle of the FPGA.

Please refer to FIG. 8. Within a packet transmitted from the Serdes, there are many fields in the payload of the packet. For example, the first portion of a packet contains the channel information to carry information about the type of the channel; the second portion of the packet contains the interconnection data from a customer prototyping board destined to other customer prototyping boards; the third portion contains probed data from the customer prototyping board and some flags for triggering or timing controls. The interconnection data and the probe data of an emulation cycle are packed within a packet transmitted from a serial transmitting device to a destination so that the received interconnection data of the emulation cycle is being forwarded to the destination while the probe data of the emulation cycle is being received by the controller. By doing so, the efficiency and performance can be increased. If there is a trigger condition set along with the probe data, a bit can be allocated to indicate that the trigger condition has occurred. The controller will then collect all the triggers from all the customer prototyping boards to decide whether the entire trigger conditions are met for recording the probe data of all the customer prototyping boards.

As shown in FIG. 9, the interconnection data order in a packet from each board can be pre-arranged to avoid congestion so that the interconnection data can be delivered to the destination board concurrently. The boundary of interconnection data destined to different customer prototyping boards can be determined by counting the number of bits for each destination board or inserting address bits in between.

In one embodiment, for a synchronous design, to ensure proper function of the prototype boards, the clocks must run synchronously on all FPGAs. The definition of sync or clocking is basically to ensure all the valid data both in and out are available for processing. Each FPGA board is executing the same clock cycle for each domain clock. The top level controller is therefore to play the role of central sync to ensure that all the data bits for each FPGA board are ready before triggering the next cycle of the FPGA. The L1 controller will ensure the right time to issue the domain clock to FPGA boards. The FPGA clocks are assumed to be transformed properly into domain clocks as described in U.S. Pat. No. 7,117,143 "Clock distribution in a circuit emulator". After setup, L1 controller knows the number of bits needed to be transported to as well as number of bits to be received from each FPGA. Therefore L1 controller has a pre-knowledge of the time all the data are communicated, i.e. the mark of timing. Each FPGA takes the mark from their local controller and runs the same cycle independently. There are many ways to decide the mark of timing or the time to kick off next cycle for each FPGA. For example, each FPGA must receive all the required number of interconnection data bits before kicking off the next cycle. Alternatively, each FPGA waits a pre-calculated time interval or an ending flag, in a packet, to indicate the last transfer of the interconnection data before kicking off the next cycle.

Figure 5:
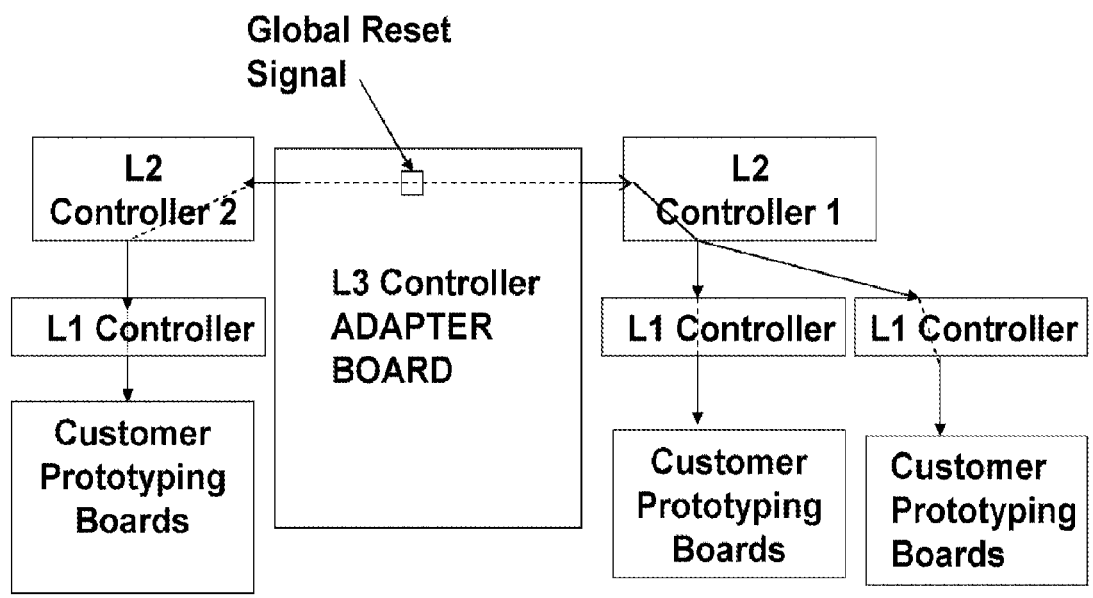
FIG. 5 illustrates a global reset signal generated from the highest level adaptor and sent to all lower level adaptor boards and in turn to all customer prototyping boards to ensure that each board receives the global reset signal at the same cycle consistent with disclosed embodiments.

Global signals like reset to be ensured to arrive at each FPGA on the same cycle. As shown in FIG. 5, a global reset signal is generated from the highest level adaptor and sent to all the lower level adaptor boards and in turn to all the customer prototyping boards to ensure that each board receives the global reset signal at the same cycle.

In another embodiment, for an asynchronous design, there is no sync issue if we can partition the design into separated clock domains and also each FPGA houses only a single clock domain, but each domain can be located in several FPGA boards. Controllers should be communicated by the cycle of the fastest domain. If there are data communicated between different domains, user should ensure their sync circuitry works. If different clock domains co-exist in one FPGA board, the fastest domain (FD) should be used as cycle by cycle to communicate data. Each domain can be scheduled to compute data by how many FD clocks. The controller for controlling each FPGA board can then enable the data to the FPGA board for computation. If there are data communicated between different domains, user should ensure their sync circuitry works. In one embodiment, the base clock is defined to be the clock to process data for fiber channel in FPGA device. For example, 106.25 MHz is used to process 32 bits data communicating through the fiber channel. Therefore 106 MHz is the base clock. The FD (fastest domain) clock can then be rationalized with base clock. The rest of the domain clocks can then be rationalized to the FD clock.

Figure 6:
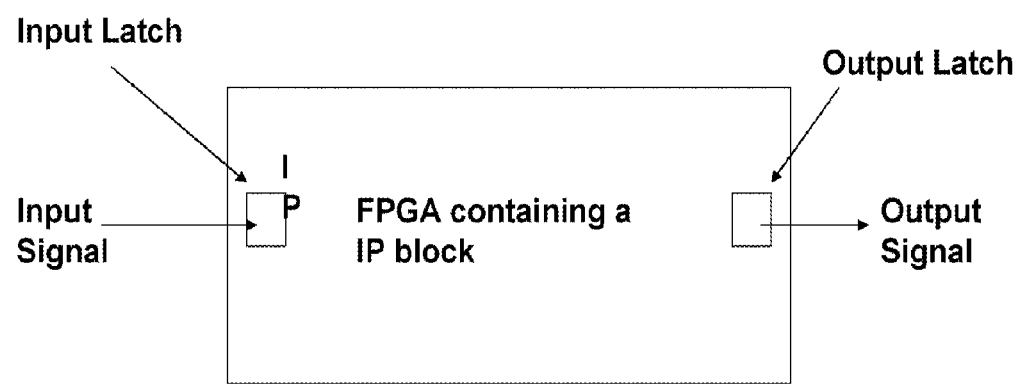
FIG. 6 illustrates that each IP block in a FPGA has an input latch and an output latch for communicating with external world consistent with disclosed embodiments.

Top level partition is interconnection driven to reduce the number interconnection bit across the board. For SoC design, it is basically follow IP block boundary. A special resource on board is reserved to handle interconnection fabric as well as co-Emulation interface logic. With the interconnection fabric allocated to a special resource, it enables the IP reuse mechanism. As well known, the main drawback in using FPGA for verification system is its long P&R time. For SoC design methodology, the potential change of net-list is mainly its interconnection fabric and arbitration block due to the number of IP changed. With interconnection fabric allocated to a special resource, we can reuse the existing IP by just recompile interconnection fabric. P&R time is therefore reduced significantly. As shown in FIG. 6, each IP block in a FPGA has an input latch and an output latch for communicating with external world and the communication can be done in one phase and execution to be done in the other phase.

In this way, the clock for communication and execution are not required to be same duty cycle.

Various embodiments of any of one or more inventions whose teachings may be presented within this disclosure can be implemented in the form of logic in software, firmware, hardware, or a combination thereof. The logic may be stored in or on a machine-accessible memory, a machine-readable article, a tangible computer-readable medium, a computer-readable storage medium, or other computer/machine-readable media as a set of instructions adapted to direct a central processing unit (CPU or processor) of a logic machine to perform a set of steps that may be disclosed in various embodiments of an invention presented within this disclosure. The logic may form part of a software program or computer program product as code modules become operational with a processor of a computer system or an information-processing device when executed to perform a method or process in various embodiments of an invention presented within this disclosure. Based on this disclosure and the teachings provided herein, a person of ordinary skill in the art will appreciate other ways, variations, modifications, alternatives, and/or methods for implementing in software, firmware, hardware, or combinations thereof any of the disclosed operations or functionalities of various embodiments of one or more of the presented inventions.

The disclosed examples, implementations, and various embodiments of any one of those inventions whose teachings may be presented within this disclosure are merely illustrative to convey with reasonable clarity to those skilled in the art the teachings of this disclosure. As these implementations and embodiments may be described with reference to exemplary illustrations or specific figures, various modifications or adaptations of the methods and/or specific structures described can become apparent to those skilled in the art. All such modifications, adaptations, or variations that rely upon this disclosure and these teachings found herein, and through which the teachings have advanced the art, are to be considered within the scope of the one or more inventions whose teachings may be presented within this disclosure. Hence, the present descriptions and drawings should not be considered in a limiting sense, as it is understood that an invention presented within a disclosure is in no way limited to those embodiments specifically illustrated.

Accordingly, the above description and any accompanying drawings, illustrations, and figures are intended to be illustrative but not restrictive. The scope of any invention presented within this disclosure should, therefore, be determined not with simple reference to the above description and those embodiments shown in the figures, but instead should be determined with reference to the pending claims along with their full scope or equivalents.

What is claimed is:
1. A method for emulating a circuit design using a plurality of prototyping boards, the method comprising:
 connecting a first prototyping board having a set of programmable logic components to a first interface having a set of programmable logic components using a first set of wires, the first prototyping board being described by a first plurality of board description files;
 partitioning the circuit design according to the first plurality of board description files into the first prototyping board using the set of programmable logic components of the first prototyping board for emulating the circuit design;

configuring the set of programmable logic components of the first prototyping board with a module configured to transmit data between the first prototyping board and the first interface using at least one of the first set of wires; and configuring the set of programmable logic components of the first interface with at least one of interface logic that provides communication with another interface or workstation connected to the first interface using a second set of wires or an interconnection fabric that provides communication between a plurality of prototyping boards.

2. The method of claim 1 wherein the module is configured to probe the emulation of the circuit design and communicate probe data to the first interface.

3. The method of claim 2 wherein the module is configure to communicate the probe data to the first interface using the at least one of the first set of wires and a serial protocol.

4. The method of claim 1 wherein the module is configured to receive interconnect data associated with another partition of the circuit design from the first interface.

5. The method of claim 4 wherein the module is configure to receive the interconnect data from the first interface using the at least one of the first set of wires and a serial protocol.

6. The method of claim 1 wherein the interface logic is configured to receive probe data from the first prototyping board using the at least one of the first set of wires and a serial protocol.

7. The method of claim 1 wherein the interconnection fabric is configured to route interconnect data between the plurality of prototyping boards using a packet protocol.

8. The method of claim 1 further comprising:
connecting a second prototyping board having a set of programmable logic components to the first interface using a third set of wires, the second prototyping board being described by a second plurality of board description files;
partitioning the circuit design according to the second plurality of board description files into the second prototyping board using the set of programmable logic components of the second prototyping board for emulating the circuit design; and
configuring the set of programmable logic components of the second prototyping board with a module configured to transmit data between the second prototyping board and the first interface using at least one of the third set of wires; and
configuring the set of programmable logic components of the first interface with an interconnection fabric that provides communication between the first prototyping board and the second prototyping board.

9. The method of claim 8 wherein configuring the set of programmable logic components of the first interface with the interconnection fabric comprising configuring the first interface to route interconnection data between the first prototyping board and the second prototyping board using a serial protocol.

10. The method of claim 1 further comprising:
connecting the first interface using a third set of wires to a hierarchy of interfaces configured to provide communication between one or more prototyping boards and corresponding interfaces and route interconnection data between the one or more prototyping boards.

11. A system for emulating a circuit design using a plurality of prototyping boards, the system comprising:
a first sub-system having circuitry configured to serially transmit interconnection data and probe data for each emulation cycle to each of the plurality of prototyping boards; and
a second subsystem having circuitry configured to control circuit emulation of a portion of the circuit design partitioned across the second subsystem and each of the plurality of prototyping boards associated with the first sub-system and circuitry configured to receive serially transmitted interconnection data and probe data for each emulation cycle from each of the plurality of prototyping boards.

12. The system of claim 11 wherein the interconnection data and the probe data of an emulation cycle are packed within a packet.

13. The system of claim 11 wherein the second subsystem is configured to control circuit emulation of a portion of the circuit design associated with a third sub-system, the second sub-system having circuitry configured to forward the interconnection data of an emulation cycle to the third subsystem.

14. The system of claim 11 wherein the second subsystem is configured to forward the interconnection data of an emulation cycle to a workstation.

15. The system of claim 11 wherein the second subsystem includes circuitry configured to forward the interconnection data of an emulation cycle to a third subsystem having circuitry configured to control transmissions of interconnection data and probe data for each emulation cycle.

16. The system of claim 11 wherein a first sub-system is configured to serially transmit interconnection data and probe data for each emulation cycle using a packet protocol.

17. A co-emulation and co-simulation interface comprising:
control circuitry configured to control emulation of a portion of the circuit design partitioned across the control circuitry and one or more custom prototyping boards; and
communication circuitry configured to provide communication between the control circuitry and the one or more custom prototyping boards, communication between the one or more custom prototyping boards, and communication between the control circuitry and one or more co-emulation and co-simulation interfaces.

18. The co-emulation and co-simulation interface of claim 17 wherein the communication circuitry is configured to provide the communication between the control circuitry and the one or more custom prototyping boards using a serial protocol.

19. The co-emulation and co-simulation interface of claim 17 wherein the communication circuitry is configured to forward the communication between the control circuitry and the one or more custom prototyping boards to the one or more co-emulation and co-simulation interfaces.

20. The co-emulation and co-simulation interface of claim 17 wherein the one or more co-emulation and co-simulation interfaces are configured to control the control circuitry.

* * * * *